March 27, 1962 R. W. KETCHLEDGE 3,027,518

AUTOMATIC GAIN CONTROL SYSTEM

Filed March 31, 1960

INVENTOR
R. W. KETCHLEDGE

BY John K. Mullarney

ATTORNEY 3,027,518

AUTOMATIC GAIN CONTROL SYSTEM

Raymond W. Ketchledge, Whippany, N.J., assignor to Bell Telephone Laboratories, Incorporated, New York, N.Y., a corporation of New York Filed Mar. 31, 1960, Ser. No. 19,051

3 Claims. (Cl. 330—24)

The present invention relates to automatic gain control systems for signal translating apparatus, and more particularly to an automatic gain control system for use in transistorized signal receivers.

Signal receivers are generally provided with an automatic gain control (AGC) system for maintaining the amplitude of the signal applied to the second detector substantially constant over a relatively wide range of variation in the amplitude of the received signal. By providing an AGC system for a receiver the latter can be tuned from strong to weak signals without the necessity of resetting the manual gain or volume control. Such systems are quite conventional in radio receivers employing electron tubes and, likewise, it is considered desirable to employ them in transistorized signal receivers.

The automatic gain control systems used heretofore in transistorized receivers are generally of two types, i.e., emitter current gain control and collector voltage gain control. In both types, the automatic gain control signal is derived from the second detector (usually a crystal diode) and, after filtering, is applied to several of the amplification stages preceding the second detector. With the emitter current gain control arrangement, the emitter currents of the transistors comprising said amplification stages are varied inversely with the strength of the received signal. Thus, in the presence of a strong signal, the emitter currents of the respective stages are reduced to thereby reduce the respective gains of said stages. In the presence of a weak signal, emitter current and gain are increased.

One common method of collector voltage control relies on the presence of a resistor, in the detector circuit, which is common to the collector circuits of the IF amplifiers. The detector draws an increased current as the carrier level of the received signal increases. This increased current produces an increased voltage drop across the common resistor, thereby reducing the collector voltage of the IF stages. The gain of each transistorized amplifier stage varies directly with collector voltage.

Collector voltage control is not as predictable or as convenient to employ as is emitter current AGC. Therefore, control is generally restricted to emitter current AGC ("Junction Transistor Electronics," by R. B. Hurley, John Wiley & Sons, Inc., 1958).

The AGC systems considered above control the gain of a transistor amplifier over a range of approximately 20 db. Received signals, however, often vary in amplitude over a range greatly in excess of this. Thus, it is generally necessary when using the aforementioned AGC systems to control the gains of a plurality of cascaded amplifiers.

It is, therefore, the object of the present invention to increase the amplitude range over which a single transistor amplifier can regulate.

A further object is to increase substantially the volume range of transistor amplifier automatic gain control operation.

These and other objects are obtained in accordance with the present invention wherein a diode is connected between a source of AGC voltage and the base of a transistor amplifier which is typically connected in common emitter fashion. The forward bias voltage normally applied to the base of the transistor serves to back-bias said diode. The AGC voltage is of a polarity such that it overcomes, at a given level thereof, the diode back-bias, thereby causing the latter to conduct. The AGC voltage is thus applied to the transistor base where it adds to the applied forward bias and shifts the transistor operating point toward saturation. The gain of the amplifier stage is significantly reduced by operating the transistor in the saturation region. In addition, the diode is series connected with a capacitor between the base and ground. Hence, with the diode conducting, a low impedance signal path to ground is provided, reducing the incoming signal and hence the output signal still further.

In accordance with a further feature of the invention, selected delayed AGC operation is achieved by control of the forward bias potential at the transistor base. As indicated above, this forward bias potential also serves to back-bias the diode and thus it controls the point at which the diode conducts.

Other objects and features of the invention will be more readily understood from the following detailed description taken in conjunction with the accompanying drawing in which.

Figure 1:
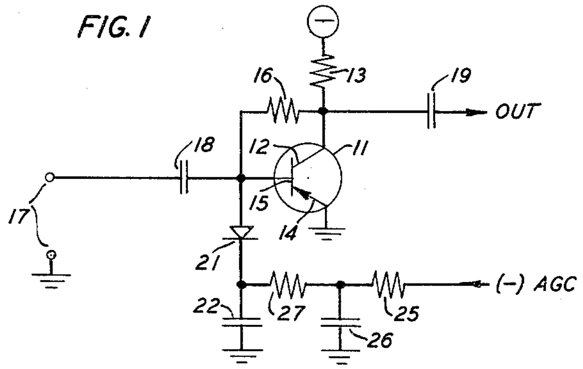
FIGS. 1 and 2 are schematic circuit diagrams of transistorized amplification stages and the automatic gain control systems therefore in accordance with the present invention.

Referring now to FIG. 1 of the drawings, there is shown an amplifier comprising a transistor 11 connected for signal amplification operation in common emitter configuration. The amplifier constitutes a single amplification stage of signal translating apparatus such as a radio receiver. In conventional fashion, this stage precedes the second detector stage from which an automatic gain control voltage is usually derived.

As illustrated, the transistor 11 may be of the conventional p-n-p junction type. Accordingly, the collector 12 is connected to a negative source of potential via the collector load resistor 13. The emitter 14 is connected directly to ground; and the base 15 is connected to the negative potential source, via resistors 13, 16 for the purpose of providing the desired emitter-base forward bias. The base, therefore, is at a small D.-C. negative potential, e.g., several tenths of a volt. Input signals are applied to the amplifier circuit through a pair of terminals 17, one of which is grounded and the other of which is connected through a coupling capacitor 18 to the base 15. The output signal appearing at the collector 12 is coupled via capacitor 19 to the next succeeding stage (not shown) of the signal translating apparatus. As will be obvious to those in the art, the amplifier thus far described constitutes a rather conventional resistance-capacitance coupled transistor amplification stage.

A diode 21 is connected at its anode to the base 15, while its cathode is connected through capacitor 22 to ground. A negative, automatic gain control (AGC) voltage, derived in any conventional fashion, is filtered in the resistance-capacitance filter network 25, 26, and 27 and applied to the junction of the diode 21 and capacitance 22.

The diode 21 is normally slightly back-biased by the small negative potential appearing at the base 15 and thus the diode does not affect the transistor bias or gain. However, as the carrier level of the incoming signal increases, the derived AGC voltage will reach a point at which the diode back-bias is overcome and the diode conducts. With the diode 21 conducting, the negative AGC potential is delivered to the base 15 where it adds to the normally applied forward bias and drives the transistor operating point toward saturation.

Figure 3:
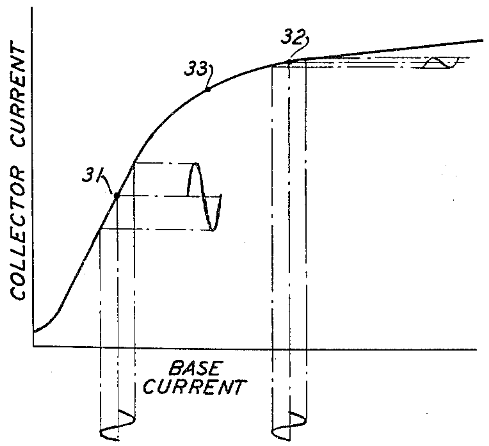
FIG. 3 is a dynamic transfer characteristic curve useful in explaining the operation of the present invention.

The gain of the transistor amplifier is significantly reduced by operating the transistor in or near the region of saturation. This will be apparent from an examination of FIG. 3 which shows a conventional dynamic transfer characteristic curve of a common emitter amplifier. This curve provides an indication of the behavior of the collector current under the influence of a signal applied to the base. The point 31, approximately centered in the linear portion of the curve, represents normal operation and, as indicated symbolically in the figure, any variation induced in the base current by an incoming signal is reflected as an amplified variation in collector current. However, at the points 32, 33 which lie, respectively, in and near the saturation region, similar variations in base current result in substantially reduced collector current variations. Thus, when operating at the points 32, 33 the resultant collector current variations and hence amplifier gain are reduced.

In addition to the above effect, the conducting diode and capacitor series circuit constitutes a rather low impedance signal path to ground for the incoming signal, thus reducing the level of the incoming signal and hence the level of the output signal. Extremely large positive transients in the incoming signal are, to a large extent, shorted to ground via diode 21 and capacitor 22; and large negative transients are shorted to ground via the emitter-base diode, producing only small collector current variations.

Figure 2:
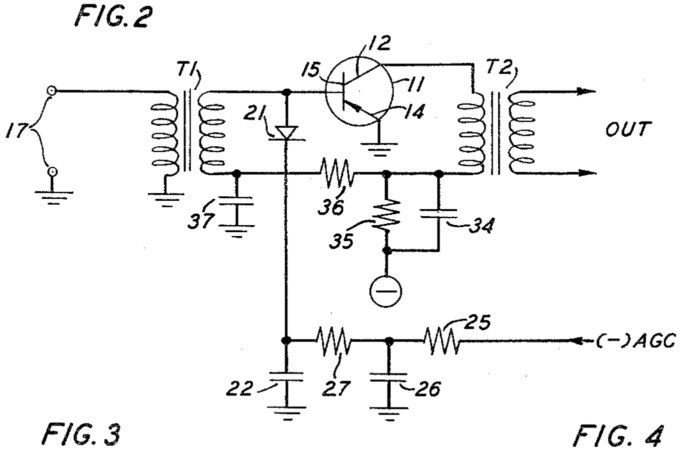

In FIG. 2 there is shown a transformer coupled transistor amplifier and an AGC system therefor in accordance with the present invention. Input signals are applied to the amplifier via transformer T1 and transformer T2 couples the output signals to the next succeeding stage of the signal translating apparatus. Negative bias is applied to the collector 12 via resistor 35 and to the base via resistors 35, 36. The capacitor 34 is connected across resistor 35 to prevent dissipation of the A.-C. signal in the latter. The output signal therefore appears substantially across the primary of transformer T2. Likewise, capacitor 37 is used to bypass resistor 36. The AGC system is structurally and functionally identical to that of FIG. 1 and therefore detailed discussion thereof is unnecessary.

Figure 4:
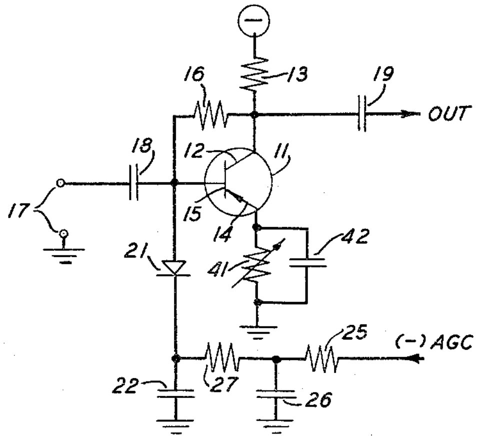
FIG. 4 is a modification of the circuit of FIG. 1 for achieving selected delayed AGC action.

Delayed AGC operation is achieved in FIGS. 1 and 2 to the extent that the diodes 21 thereof are back-biased. The amount of delay can be controlled to some extent through the choice of the type diode and transistor utilized. For example, silicon devices tend to have higher threshold voltages than germanium devices and therefore they offer increased delay possibilities. In FIG. 4 there is shown a modification of the FIG. 1 arrangement wherein selected delayed AGC is provided. Except for the addition of a variable resistor 41 and shunt capacitor 42 connected between the emitter 14 and ground, the circuit of FIG. 4 is similar to that of FIG. 1. The resistors 13 and 16, the emitter-base diode of the transistor and the variable resistor 41 comprise a voltage divider connected between the negative source of potential and ground. The base 15 is at a slight D.-C. negative potential with respect to the emitter 14 (i.e., the transistor is forward biased) and the latter is at a potential dependent upon the resistance between it and ground. Accordingly, the base potential can be varied by varying the resistance between the emitter and ground. The potential, however, further serves to back-bias the diode 21 and thus the point at which diode 21 conducts can be altered by variable resistance 41. A variable delayed AGC action is therefore achieved.

The bypass capacitor 42 effectively shorts the emitter to ground for A.-C. signals. Except for the selected delayed AGC action, the circuit of FIG. 4 functions in identical fashion to FIG. 1.

While the transistors employed have been shown and described as p-n-p junction transistors, it is obvious that n-p-n junction transistors are equally suitable so long as the polarities of the direct current potential source and the AGC voltage are reversed. In this instance, the direction of easy current flow of the AGC diode 21 would have to be reversed. Further, while satisfactory gain control is obtained with a single amplifier stage, the AGC scheme of the present invention can, of course, be used in combination with a plurality of cascaded amplifiers and the selected delayed AGC operation of each can be the same or different. It is understood therefore that the foregoing disclosure relates to only preferred embodiments of the invention and that numerous modifications or alterations may be made therein without departing from the spirit and scope of the invention.

What is claimed is:

1. A signal amplifier comprising a transistor having a base, an emitter, and a collector operatively connected in common emitter configuration, means connecting said emitter to ground, a diode having one terminal connected directly to said base and the other terminal connected through a capacitor to ground, the poling of said diode with respect to ground being the reverse of that of the base-emitter path of said transistor, a direct current source of energizing potential, means connecting the junction of said diode and said base to said source to forward bias the base-emitter path of said transistor and back-bias said diode, means for overcoming said back-bias and driving said transistor to saturation at a preselected level of automatic gain control voltage, said driving means comprising a source of automatic gain control voltage of the same polarity as the energizing potential applied to said base, and means for coupling said automatic gain control voltage to the junction of said diode and said capacitor.

2. A signal amplifier as defined in claim 1 wherein the first recited means comprises a variable resistance connected between the emitter electrode and ground.

3. Signal translating apparatus comprising a transistor having an input electrode, an output electrode and a common electrode, means connecting said common electrode to a point of reference potential, a diode having one terminal connected directly to said input electrode and the other terminal connected through a capacitor to said point of reference potential, the poling of said diode with respect to said point of reference potential being the reverse of that of the diode path comprising said input and common electrodes, a direct current source of energizing potential, means connecting the junction of said diode and said input electrode to said source to forward bias said input electrode with respect to said common electrode and to back-bias said diode, means for overcoming said back-bias and for driving said transistor to saturation at a preselected level of automatic gain control voltage, said driving means comprising a source of automatic gain control voltage of the same polarity as the energizing potential applied to said input electrode, and means for coupling said automatic gain control voltage to the junction of said diode and said capacitor.

References Cited in the file of this patent

UNITED STATES PATENTS 2,954,530 Haskell _______________ Sept. 27, 1960

OTHER REFERENCES

Shea: "Principles of Transistor Circuits," Sept. 15, 1953, page 179.